(12) United States Patent
Limbacher (10) Patent No.: US 12,120,833 B2
(45) Date of Patent: Oct. 15, 2024

(54) EXPLOSION-PROOF HOUSING HAVING INTERNAL PRESSURE REDUCTION, METHODS

(71) Applicant: R. Stahl Schaltgeräte GmbH, Waldenburg (DE)

(72) Inventor: Bernd Limbacher, Schwäbisch Hall (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 1005 days.

(21) Appl. No.: 16/982,965

(22) PCT Filed: Nov. 29, 2018

(86) PCT No.: PCT/EP2018/083038
§ 371 (c)(1),
(2) Date: Sep. 21, 2020

(87) PCT Pub. No.: WO2019/179646
PCT Pub. Date: Sep. 26, 2019

(65) Prior Publication Data
US 2021/0020388 A1    Jan. 21, 2021

(30) Foreign Application Priority Data
Mar. 22, 2018    (WO) ................ PCT/EP2018/057338

(51) Int. Cl.
*H05K 5/02* (2006.01)
(52) U.S. Cl.
CPC ......... *H05K 5/0217* (2013.01); *H05K 5/0209* (2022.08)

(58) Field of Classification Search
None
See application file for complete search history.

(56) References Cited

U.S. PATENT DOCUMENTS

| | | | |
|---|---|---|---|
| 3,607,604 A * | 9/1971 | Nava | B32B 5/16 174/650 |
| 4,180,177 A | 12/1979 | Gunderman et al. | |
| 8,578,866 B2 * | 11/2013 | Luling | E05G 1/005 428/317.1 |
| 9,908,679 B2 * | 3/2018 | Limbacher | A62C 4/00 |
| 2011/0002494 A1 * | 1/2011 | Opitz | B22F 3/1125 381/334 |

(Continued)

FOREIGN PATENT DOCUMENTS

| CN | 102523714 A | 6/2012 |
|---|---|---|
| CN | 103260710 A | 8/2013 |
| CN | 203801184 U | 8/2014 |

(Continued)

*Primary Examiner* — Don M Anderson
(74) *Attorney, Agent, or Firm* — Blank Rome LLP (57) ABSTRACT

A housing that can be provided on the inside with a lining, made of an open-pore material and preferably covering at least two sides of the housing, for the reduction of internal explosion pressure. In addition, or alternatively, a molded body made of the open-pore material, in particular a bonded fiber material, can be arranged in the housing. Methods are used to provide an assembly of an open-pore material and a flameproof body in order to create an assembly that has a higher temperature class and/or a higher flameproofing class than those for which the flameproof body is designed.

10 Claims, 9 Drawing Sheets

(56) References Cited

U.S. PATENT DOCUMENTS

| | | | | |
|---|---|---|---|---|
| 2015/0286250 A1* | 10/2015 | Sailer | ................... | H05K 5/068 |
| | | | | 455/575.8 |
| 2020/0296848 A1* | 9/2020 | Hansen | ................ | H02B 13/025 |

FOREIGN PATENT DOCUMENTS

| | | |
|---|---|---|
| DE | 261 063 A3 | 10/1988 |
| DE | 198 26 911 A1 | 1/2000 |
| DE | 102 45 307 A1 | 4/2004 |
| DE | 198 60 283 B4 | 9/2005 |
| DE | 20 2008 000 808 U1 | 8/2008 |
| DE | 10 2005 042 565 B4 | 8/2009 |
| DE | 10 2009 025 296 A1 | 12/2010 |
| DE | 10 2013 204 585 A1 | 9/2014 |
| DE | 10 2013 006 738 A1 | 10/2014 |
| DE | 10 2013 109 259 A1 | 3/2015 |
| DE | 10 2014 206 433 B3 | 8/2015 |
| DE | 10 2014 206 436 B3 | 8/2015 |
| DE | 10 2014 110 654 A1 | 2/2016 |
| DE | 20 2016 000 506 U1 | 6/2016 |
| DE | 10 2015 206 355 A1 | 10/2016 |
| DE | 20 2015 005 015 U1 | 11/2016 |
| DE | 10 2010 016 782 B4 | 12/2016 |
| EP | 0523353 A1 | 1/1993 |
| EP | 1 369 628 B1 | 9/2005 |
| RU | 2 448 228 C2 | 4/2012 |
| RU | 133 278 U1 | 10/2013 |
| WO | WO2011/134770 | * 11/2011 |

* cited by examiner

EXPLOSION-PROOF HOUSING HAVING INTERNAL PRESSURE REDUCTION, METHODS

CROSS REFERENCE TO RELATED APPLICATIONS

This application is a national phase of PCT/EP2018/083038, filed Nov. 29, 2018, which claims the benefit of PCT/EP2018/057338, filed Mar. 22, 2018, the subject matter of each of which are incorporated by reference herein in their entirety.

TECHNICAL FIELD

Subject matter of the invention is an explosion-proof housing, particularly a housing with one or multiple chambers in the ignition protection type Ex-d, as well as methods.

BACKGROUND

In explosive areas housings of the ignition protection type Ex-d are frequently used. Such housings are configured in a resistant manner, such that they withstand an ignition of an explosive gas mixture in their inner space and the pressure increase resulting from the occurring explosion. In addition, the housings are configured such that no flames or glowing particles acting as ignition sources can escape therefrom to the outside. If gaps are present, they have to comprise a minimum length and shall not exceed a maximum width. Present housing openings are provided with pressure relief bodies that are also called flame protection filters and prevent that a flame ignited in the housing leaks out and ignites explosive mixture that is present in the environment, wherein on the other hand they effect a pressure compensation with the environment.

DD 261063 A3 describes an explosion-protected housing with a porous body arranged in its inner space, e.g. from slag wool, glass wool, metal or ceramic with open continuous pores or gaps. Such a body arranged in the housing shall lead to a decrease of the explosion pressure about approximately 90%.

DE 198 60 286 B4 discloses a housing provided for a display, the inner space of which is partly filled with a porous damping material for decrease of the explosion pressure. The material comprises a multiplicity of non-closed, but continuous channels with a small cross-section in form of pores or gaps. In doing so, the explosion pressure shall be lowered to only about 10% of the explosion pressure that would otherwise occur in an empty housing.

In addition, DE 10 2014 206 433 B3 proposes the arrangement of a tablet computer in an explosion-proof housing provided with a glass plate, wherein a damping element of open-pore rock wool, quartz wool, glass wool, metal foam or the like is arranged in the tablet computer.

The known housing with bodies of open-pore material are partly specific solutions that are quite expansive and/or adapted to specific requirements, as e.g. tablet computers.

DE 10 2013 109 259 A1 describes, however, an explosion-protected housing in the ignition protection category "flameproof enclosures (Ex-d)", in the housing wall of which a porous pressure relief body is present through which an explosion pressure that has built up in the housing can escape to the outside. This principle is also used by the housings according to U.S. Pat. No. 4,180,177 as well as DE 10 2010 016 782 B4.

If such housings are arranged in adverse environments, pressure relief bodies of this type are subject to contamination or when they are affected by weather conditions are subject to bacterial contamination, icing and/or corrosion.

SUMMARY

It is an object of the invention to provide a concept for an explosion-proof housing that can be versatilely used and is less elaborate.

This object is achieved with the housing arrangement according to claim 1 and the housing arrangement according to claim 9:

The inventive housing comprises a wall arrangement with multiple walls that surround an inner space. At least one of the walls is provided with an open-pore material.

With the open-pore material a cooling and thus a remarkable gas pressure reduction resulting from an explosion can be achieved.

The section of the wall supporting the open-pore material can comprise an opening that is provided with a gas permeable flameproof body. The terms flameproof and ignition proof are synonymously used in this application. A flameproof or ignition proof body is also referenced as pressure relief body.

In embodiments the open-pore material is arranged in front of the flameproof body, i.e. between the inside of the housing and the flameproof body. The open-pore material causes a cooling of the gas in case of the occurrence of an explosion such that the gas reaches the flameproof body in a cooled condition.

In preferred embodiments the flameproof body is solely or at least primarily configured and particularly preferably tested (type and/or individual inspection) to guarantee flameproof condition, e.g. configured to fulfill the flameproof test (e.g. for the groups IIA, IIB or IIC according to the standard IEC/EN 60079-1). Due to the gap dimension, the body is also configured to ensure that hot gases or plasma, particularly sparks, are cooled or extinguished when passing through the flameproof gaps of the body thus far, that an explosive atmosphere outside of the inner space is not ignited by the gas or plasma passing through the gaps, even without the open-pore material arranged upstream. However, in these embodiments, solely with the flameproof body, the target temperature class of the surface of the flameproof body or the housing cannot be achieved yet. Preferably only the combination of open-pore material and the flameproof body is configured such that the surface temperature of the flame-proof body and/or the housing remains below a predefined maximum temperature in case of an explosion in the inner space. In the embodiments only the arrangement with the open-pore material in front of the flameproof body is configured and preferably tested (type or individual test) to comply with the desired temperature class (e.g. classes T1, T2, T3, T4, T5 or T6 of the standard IEC/EN 60079-0) of the temperature of the surface of the flameproof body or the housing. Preferably solely the open-pore material, i.e. without being combined with the flameproof body, is not flameproof. The high requirements in terms of gap dimensions to avoid ignition are imposed on the body, but not on the open-pore material. Particularly the average ratio of gap width to gap length can be less in the flameproof body than in the open-pore material.

It is also possible that the flameproof body individually is configured and tested, particularly type or individually inspected for being flameproof and also for compliance of a temperature of the housing or the body below a predefined maximum temperature. In such embodiments the arrangement of open-pore material and the flameproof body can be configured and preferably tested, particularly type or individually tested to comply with a higher, particularly the next higher temperature class. The higher the temperature class (e.g. T1 to T6 of the standard IEC/EN 60079-0), the smaller the maximum allowable surface temperature. Also in these embodiments preferably solely the open-pore material is not flameproof.

Alternatively or additionally, it is possible that the flameproof body is individually configured and tested, particularly type or individually tested, for being flame-proof in a specific group (e.g. IIA or IIB of the standard EN/IEC 60079-1) and that the arrangement with open-pore material and the flameproof body is configured and preferably tested, particularly type or individually tested, for a higher group in terms of flameproof condition. While the flame-proof body individually achieves for example the group IIA, the combination of open-pore material and flameproof body is, for example configured and tested, particularly type or individually tested, for complying with group IIB. Alternatively, for example a configuration of the combination for the group IIC can be achieved starting from the group IIA or IIB for the flameproof body. Solely the open-pore material is preferably not configured to be flameproof.

In preferred embodiments the open-pore material enables the flameproof body such that the combination fulfills stricter requirements (lower maximum temperature) for the maximum surface temperature and/or a stricter requirement for a higher flameproof category.

The open-pore material can be connected, e.g. sintered, with the flameproof body to form one element. Thus, a relative arrangement of the open-pore material and the flame-proof body can be defined prior to arranging the open-pore material and the flameproof body in order to provide the wall with the material and the body.

The open-pore material and/or the flameproof body can comprise a grid arrangement, particularly in each case. The grid arrangement can comprise, e.g. one or more grid layers or ply. In a grid two openings of the grid are separated by a web of the respective material of the grid. The openings can partly also have the width zero. A grid arrangement or a grid layer or ply can comprise a woven fabric or a laid fabric of fibers or wires.

According to an inventive concept for simple and modular configuration of an open-pore material, the open-pore material can be formed with a bulk particulate material in a container structure. The container structure comprises at least one gas permeable limitation structure that is separate from a wall of a housing surrounding the inner space. By means of the limitation structure, a space for the particulate material is separated from the inner space of the housing. The limitation structure can be formed by a grid arrangement for example. The limitation structure can be formed by a woven fabric or a laid fabric. In embodiments the flameproof body can be part of the container structure in that the flameproof body forms a barrier for the bulk particulate material. In other embodiments the limitation structures of the container structure are separate from the flameproof body.

The bulk particulate material can comprise for example balls, especially hollow balls or balls that do not surround a hollow space, granulate or other bulk material. The particles are preferably not connected with each other by substance bond, particularly not sintered, but are—virtually being external of the container structure—movable relative to each other. The particulate material is preferably pourable. In embodiments the particles cannot engage each other and/or are not entangled with each other. In other embodiments particles can occasionally engage each other, remain however unconnected as a whole. For example, the bulk particulate material can be metal chips and/or plastic chips. In embodiments the bulk particulate material is free of fibers or fiber sections or strips or strip sections.

Preferably no static pressure is applied on the bulk particulate material by the container structure. Preferably the bulk particulate material is free of static pressure inside the container structure apart from the gravitational pressure and the static atmospheric pressure.

The bulk particulate material can have an average particle size and/or a selected size distribution of the particles. Particularly, the container structure can comprise a specific mixture of bodies having different sizes.

The container structure can accommodate a maximum amount, particularly referring to the average particle size and/or the size distribution of the bulk material, i.e. the bulk particulate material. In embodiments the container structure contains less than the maximum amount of the bulk particulate material, the degree of filling can thus be smaller than one.

The container structure can comprise at least two partitions. The particles of a partition can be the same or different from particles in another partition in terms of composition, shape and/or size. If the bulks or fills with which the partitions are filled are different, e.g. in terms of particle size, particle shape, material, total surface of the particles and/or total heat capacity of the particles and/or bulk density or degree of filling, the cooling and/or pressure relief effect of the porous material can be optimized by series arrangement of the partitions compared with an embodiment having the same filling in the partitions or having only one partition. The first partition can be, for example, directly subject to the "flame front", i.e. arranged between the ignition source and the one or more further partitions. For example, this first partition can be optimized with regard to the bulk density for transformation of kinetic energy, wherein the bulk arranged behind (downstream) is optimized with regard to cooling. The downstream bulk can for example comprise a bulk with larger surface and/or higher heat capacity compared with the bulk of the first partition and the density of the bulk particulate material in the first partition can be higher than the density of the bulk particulate material in the downstream partition. With the specific characteristics of the "bulk densities" an improvement of the total "pressure relief" system can be achieved.

The bulk particulate material in the container structure does not need to provide a flameproof condition. It serves predominantly to dampen a pressure shock, due to an explosion and/or to cool hot explosion gases. If the particles are movable relative to each other, kinetic energy of a pressure front of an explosion can be transferred on the particles, for example, and the energy can be passed from particle to particle by impacts and/or friction.

In embodiments at least two of the walls of the wall arrangement are provided with an open-pore material. If at least at two of the walls of the wall arrangement open-pore material is arranged, a pressure wave produced in the housing can be particularly efficiently obliterated by the arrangement of the open-pore material at two different walls, e.g. opposing each other or walls arranged at an angle to each other. This applies if each of the walls provided with the open-pore material is completely two-dimensionally provided with this material, as well as if the material only extends over a section of the respective wall in one or more of the walls provided with the material.

The use of at least two or more wall sections for attaching open-pore material that damps a pressure wave impacting thereon or passing along leads to a large active damping surface and thus to a high damping effect, also if only relatively thin of open-pore material are used, wherein the thickness of the layer can have an amount of less than one-tenth or one-twentieth of the housing inner diameter between opposing walls. In doing so, the part of the inner space of the housing available for accommodation of components is only slightly reduced by the open-pore material. In the housing the walls can be partly or completely covered with open-pore material. The open-pore materials act on one hand as a non-ignitable relief volume and on the other hand as extinction volume for an intruding flame front. A ball-shaped explosion front is immediately received extensively as fast as possible by the lining, wherein cooling and reception of non-burned gases is effectuated. In doing so, on one hand the amount of gases participating at the combustion or explosion is reduced and on the other hand the pressure is lowered by gas cooling. By completely coating the housing with the open-pore material at the inside, an optimized surface/volume factor is achieved for the housing.

By arranging the open-pore material preferably exclusively at the walls, a large continuous installation space for operating means, switches and the like is obtained.

Preferably the open-pore material is arranged in direct abutment with the at least two walls. The heat transfer between the open-pore material and the housing wall provided thereby cools the open-pore material, such that it comprises a high pressure-reducing effect. The housing wall forms a heat accumulator thermally connected to the open-pore material.

The open-pore material can be connected with the walls of the flameproof housing completely two-dimensionally by substance bond or only in sections by substance bond. For this the porous material can be welded to the walls or if the housing is manufactured by a molding process, connected by cast with the housing walls by insertion into the mold. Other mechanical form-fit and/or substance bond connection possibilities can be used. For example, the open-pore material can be enclosed by a grid structure that is connected with the wall arrangement. The grid structure can be a wire grid, a perforated sheet, a plastic grid or the like.

The open-pore material can have a wall-opposing surface facing the inner space at each of the walls at which it is attached. The wall-opposing surface can be arranged parallel to the wall or in an acute angle thereto. The porous material can be formed as plate or mat or filling with substantially constant thickness, such that the wall-opposing surface is arranged parallel or in an acute angle to the wall. Thus, at least two surfaces of the open-pore material face each other in the inner space substantially or in an angle to each other. Both leads to an effective damping of a dynamically passing flame front.

Pressure relief bodies can be arranged at locations of the wall free of open-pore material or at locations of the wall covered by open-pore material. While the open-pore material itself does not or is not required to provide protection against flame breakthrough, the flameproof condition to the outside is provided by the pressure relief body or bodies. The open-pore material serves primarily to gas cooling and thus the reception of heat energy and the mitigation of pressure peaks. With regard to the gas flow the heat reception device formed by the open-pore material and the flameproof protection are arranged in series. Due to the combination of the non-flameproof material with a flameproof protection, a pressure relief with improved effectivity is created. This applies independent from whether the open-pore material is arranged at the inner side of a single housing wall or at multiple housing walls.

In a preferred embodiment, however, pressure relief bodies and thus an outer pressure compensation can be avoided in that the open-pore material attached inside at the walls leads to a quick cooling and thus to a very remarkable pressure reduction. The open-pore material can be formed by one or more bodies of metal foam, sintered metal particles, metal fibers, particularly stainless steel wool, other metal fibers, metal wires, metal strips, mineral fibers such as glass fibers, rock wool fibers, quartz fibers or the like. The open-pore material can have a grid structure, a mesh structure or a woven fabric structure and can be particularly formed from multiple layers of the grid, mesh or woven fabric structure arranged on top of one another. They can lie loosely on top of one another or can be connected with each other, e.g. by sintering or another technique. The bodies of wire or fiber material can be needle felt arrangements, i.e. an entangled fiber fabric with felted fibers that are, however, not substance-bonded with each other. If required, in addition a substance bond of the fibers with each other can be provided, e.g. by a binder or by sintering. The fibers lead to a cooling of the received pressure wave by heat reception and to an obliteration of the kinetic energy of the pressure wave due to internal friction of the fibers against each other. Preferred is a material with high heat accumulation capacity such as rock wool or ceramic wool.

The fiber material of the open-pore material can be pre-pressed in a body in the form of plates, cuboids or other shapes that can be inserted, glued or screwed in the housing or that can be supported by a frame. The compacting of the fiber body is, however, so low that distances and gaps of the porous materials are at least at some locations above the gap width limit of the classic explosion protection, i.e. cooling effects, flowing effects or other kinetic effects that could avoid an ignition of gas present in the material or a passing of the flame front through the material, are not or not consistently provided. Particularly, if the open-pore material comprises a high heat capacity, as it is the case with glass fibers, quartz fibers, ceramic fibers, rock fibers, a high pressure reduction is yet achieved.

The open-pore material can also be bound by inorganic or organic binders thus far that an open-pore dimensionally stable body is created. It must not necessarily adjoin the wall. Alternatively or additionally, an open-pore dimensionally stable body can be formed by a container structure that is completely or partly filled with bulk particulate material. Such a pre-shaped bound fiber body or such bulk material comprising body can also be arranged in the housing to be accessible from four, five or six sides. It also acts in a pressure reducing manner without connection to the wall and can be used alternatively or in addition to the linings of the housing with open-pore material described above. Also the open-pore material arranged at the housing wall can be stabilized in its shape by an organic or inorganic binder. The bulk particulate material in the container structure at the wall or in the inner space is characterized particularly in that the particles are not substance bonded with each other in order to obtain an open-pore body with a large surface. The container structure can, for example, be cuboid or a cube or another three-dimensional body, in which the bulk material is accommodated.

By means of the inventive method, an arrangement of the porous material and a flameproof body can be provided. The flameproof body is configured and preferably tested independently from the porous material for a specific gas group in relation to avoiding an ignition breakthrough. For example, according to one of the groups IIA, IIB, IIC according to the standard IEC/EN 60079-1. However, the arrangement of the porous material and the body is configured to ensure the compliance of the upper limit of the temperature of the flameproof body and/or the housing that is provided with the body.

In a further inventive method for providing a device with an increased flameproof condition, an open-pore material is arranged in a body that is configured for the flameproof compliance with a specific group and preferably type tested or individually tested, wherein the arrangement of flameproof material and open-pore material created by the arrangement is configured for a higher flameproof category than the flameproof body.

Additional features and embodiments of the invention result from the claims, the drawings and the following description. The drawings show:

BRIEF DESCRIPTION OF THE DRAWINGS

FIG. 3b shows a part of an open-pore material of the housing according to FIG. 3a;

FIG. 5b shows a part of the housing according to FIG. 5a;

DETAILED DESCRIPTION

Parts and components, such as circuit boards, 17, 18 with electric components arranged thereon that can form ignition sources, can be arranged in the inner space 15.

At at least two walls 11, 12 of the housing open-pore material 19, 20 is arranged, e.g. in the form of plates, bodies or mats that covers the respective wall 11, 12 completely or partly in each case. The open-pore material can comprise fibers or particles in a form movable or connected with each other. It can comprise uniformly or non-uniformly configured and arranged pores. For example, it can be grid structures with one or multiple grids arranged on top of each other made of metal wires, ropes or strips that are arranged in a grid-shaped manner or as woven fabric. The metal wires, metal ropes or metal strips are connected with each other or they are loosely arranged on top of each other, e.g. in layers. The metal wires, metal strips or metal wires can also be formed to another mesh structure, such as for example a knitted fabric or braid. The wires, ropes or strips can also consist of another heat-absorbing material.

Thereby the open-pore material is preferably directly arranged in abutment with the respective wall 11, 12 and further preferably connected therewith. The connection can be carried out by completely two-dimensional gluing, welding or by other connection measures that lead to a partial or complete two-dimensional connection in a substance bond manner. Alternatively or additionally, the open-pore material 19, 20 can be supported in a holder that can be, for example, formed by a grid structure 21. The grid structure 21 can be a perforated sheet housing, a wire grid, a cage or the like that is connected with the housing 10 and that keeps the open-pore material 19, 20 away from the other inner space 15. In order to form open-pore material, the grid structure 21 can be filled with bulk particulate material, wherein the degree of filling can be 1 or less than 1. A high degree of filling can be, for example, necessary in embodiments in which the open-pore material is arranged in front of a pressure relief body in order to ensure that gas of an explosion front first has to pass the open-pore material in each case to reach a pressure relief body. A lower degree of filling can be sufficient for an open-pore material that is arranged at a closed area of a wall or in the inner space accessible from one, two, . . . or six sides. The bulk particulate material can comprise uniform, e.g. ball-shaped or non-uniform bodies, e.g. sand grains. The bulk particulate material is preferably not inflammable. Glass balls, hollow glass balls, metal balls, ceramic balls, polymer granulate, expanded granulate, foam balls/foam bodies, fiber balls, fiber bodies or other bulk can be used as suitable pourable bodies. In embodiments the container structure formed with the grid structure 21 can be filled with chips as bulk particulate material. The grid structure follows the walls 11 and 12 and is thus arranged over a corner. In general, the grid structure can be adapted to the housing form and/or wall form of the housing, e.g. can have a constant distance to the wall 11, 12 along the wall.

The open-pore material 19, 20 comprises side surfaces 22, 23 facing the inner space 15 that are arranged at an angle with regard to each other that is smaller than 180° as illustrated.

As an alternative or in addition to the open-pore material 20 another section 24 of open-pore material is arranged opposite to the open-pore material 19. It can be the same or a different open-pore material as the materials 19, 20. It can have the same or a different thickness. Likewise the open-pore materials 19, 20 can have the same or different thicknesses. The material 24 comprises a surface 24 facing the inner space 15 that is arranged opposite the surface 22 and arranged in an angle of, e.g. 90° to the surface 23.

The open-pore material 19, 20 and/or 24 form an inner pressure relief device. An additional or alternative inner pressure relief device can be formed by an open-pore body 26 that is free at least at four, preferably at five or six sides, i.e. not arranged abutting at one of the walls of the wall arrangement in the inner space 15 of the housing 10. The following explanations of the body 26 apply optionally also for the open-pore material 19, 20.

Figure 2:
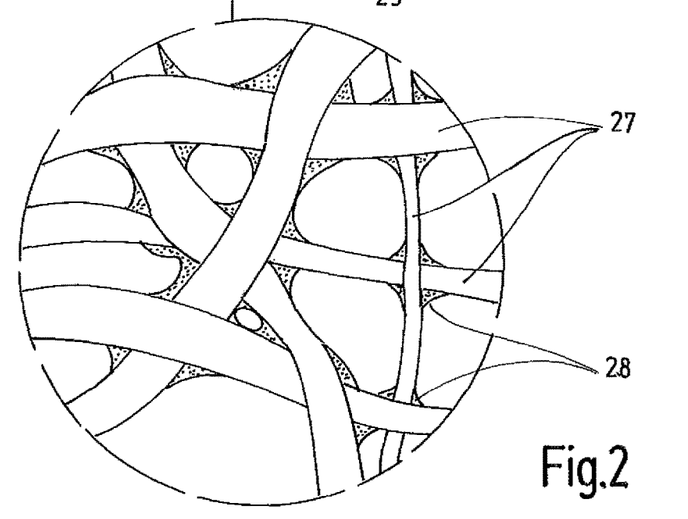
FIG. 2 shows a portion of a pressure-reducing open-pore body of the housing according to FIG. 1.

The open-pore body 26 can be a fiber body, the fibers of which are connected with each other by a binder. FIG. 2 illustrates schematically a part of the body 26. As apparent, multiple fibers 27 are entangled in a spatially disordered arrangement and are connected at least at some of their intersection locations by binder 28. The fibers can be metal fibers or mineral fibers, particularly glass fibers, quartz fibers, rock fibers, ceramic fibers. The binder 28 can be synthetic resin, particularly phenolic resin. The portion of resin is so low that pores, that are present between the fibers 27, remain open. It is, however, so large that the open-pore body 26 has a remarkable form stability such that it is not disintegrated in case of ignition of an explosion in the inner space 15 and as far as possible does not release fibers or at most a harmless quantum of fibers.

Alternatively, the fibers, wires, threads or particles of which the body 26 consists can also be arranged regularly and however be connected with each other by a binder. The fibers 27 can be similar fibers that are also used for the open-pore material 19, 20, 24. It can also be precompressed and, if desired, provided with binder.

The body 26 can be alternatively formed by a container structure that is preferably completely or partly filled with bulk particulate material. The gas permeable limitation structure of the container structure separates a partition of the inner space for the filling of bulk particulate material. In doing so, e.g. a ball bulk can be placed at an arbitrary location in the housing. The bulk particulate material can be quartz, sand or glass particles for example. The body is preferably free of electrical operating means, particularly free of electrical components. The body itself comprises gaps that do not need to be flameproof. The gaps formed by openings in the container structure as well as interstices between the particles of the filling of bulk particulate material must not have standardized dimensions such that the flameproof condition is ensured by the gaps. The body solely serves for pressure reduction in case an explosion occurs in the inner space of the housing. The housing does not need to comply with the ignition protection category "protection by powder filling" (Ex-q, according to the standard IEC 60079-5). The bulk particles in the body 26 can still move relative to each other due to the degree of filling or the container structure 41 is filled with bulk particles, such that they cannot move relative to each other.

As an option, housing 10 can be provided with at least one pressure relief device 29 and/or 30 that allows a flow connection between the housing inner space and the environment. Both pressure relief devices 29, 30 are porous gas permeable bodies having a gap width and gap length that avoids flame breakthrough (ignition breakthrough). The pressure relief device 29 is arranged in a section of the wall 14 of the housing 10 that is free from open-pore material. The pressure relief device 30 arranged additionally or alternatively is covered by the open-pore material 25 with view from the inner space 15. This, however, does not block passing of gases. This combination of heat accumulating open-pore material 25 that is, however, not flameproof and the pressure relief device 30 can be used independent from the open-pore material 19, 20.

Figure 3A:
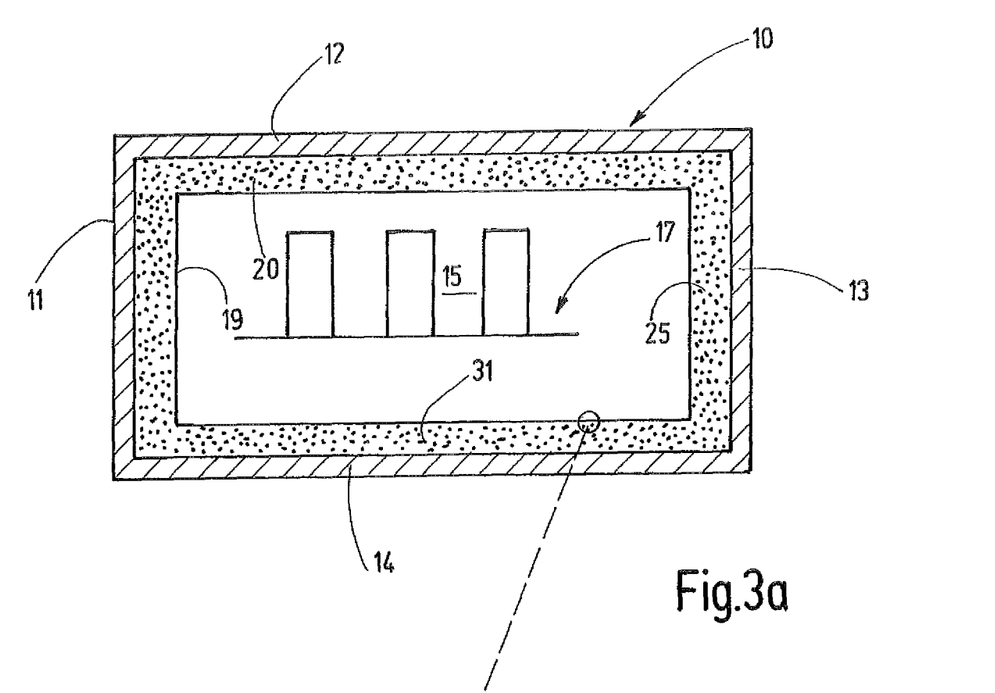
FIGS. 3a and 4 show further embodiments of the inventive housing in a schematic cross-section illustration respectively.

FIG. 3a illustrates a modified embodiment of the inventive housing 10. The description above applies accordingly under use of the already introduced reference signs. Different to the housing 10 described above, housing 10 according to FIG. 3 comprises porous material 19, 20, 25, 31 at all of the four walls 11, 12, 13, 14 of the housing and optionally in addition at the non-illustrated bottom and/or cover. The open-pore material 19, 20, 25, 31 forms a locally interrupted or also uninterrupted layer extending along the walls that receives a flame front ignited in the inner space 15 and absorbs the resulting pressure wave.

FIG. 3a illustrates an embodiment of the open-pore material 31 as container structure that is formed by the walls 11, 12, 13, 14 and a temperature-stable additional limitation structure 21 and that comprises a bulk particulate material 39, wherein connected free spaces between the particles form open pores 40 and thereby provide the ability to material 31 for passing gases into the inner of material 31 and/or through the material 31. The particles 39 in the open-pore material 31 of an arbitrary embodiment can have a uniform size or, as illustrated, different diameters. The particles 39 can have a selected size distribution that distinguishes from a size distribution with uniform size.

The additional limitation structure 21 can be, e.g. a grid structure in form of a wire grid, perforated sheet, plastic grid or the like. An additional limitation structure 21 in form of a woven fabric can be used. Independent from the specific embodiment, the container structure of the porous material of walls 11 to 14 and the limitation structure 21 ensures preferably a gas flow through the open-pore material 31 through the pores. Concurrently the opening dimensions of the container structure are so small that bulk material contained therein, i.e. the bulk particulate material, remains within the container structure. Preferably, the bulk material is abrasion resistant such that apart from the case of an explosion in the inner space during intended use, no dust or smaller particles (friction particles) can be created due to friction of the particles 39 against each other. Alternatively or additionally, the container structure is dust-tight or friction-particle-tight.

The particles are preferably incompressible in case of the dynamic pressures that occur in case of an explosion for which the housing or the arrangement is configured. Compared with a compressible open-pore material, e.g. an entangled fiber body, this can have the advantage that the interstices between the particles remain open when a pressure front impacts on the open-pore material, whereas in case of elastically flexible open-pore material, the danger exists that exactly then when the pressure front impacts on the material, the pores are closed thereby and the gas exchange through the material is affected.

The particles that are preferably not connected with each other, comprise in addition a particularly large surface, which makes the cooling by means of the open-pore material made of a container structure with bulk particulate material enclosed therein particularly effective. Particles that can freely move relative to each other in a container structure that is filled with a degree of filling smaller than 1, offers in addition the possibility to transform heat and/or pressure in kinetic energy of the particles and thus particularly effective cooling and/or pressure reduction. Alternatively, the container structure 41 of the open-pore body (e.g. body 26 in FIG. 1) or the open-pore material can be filled such that the particles cannot move relative to each other.

Figure 3B:
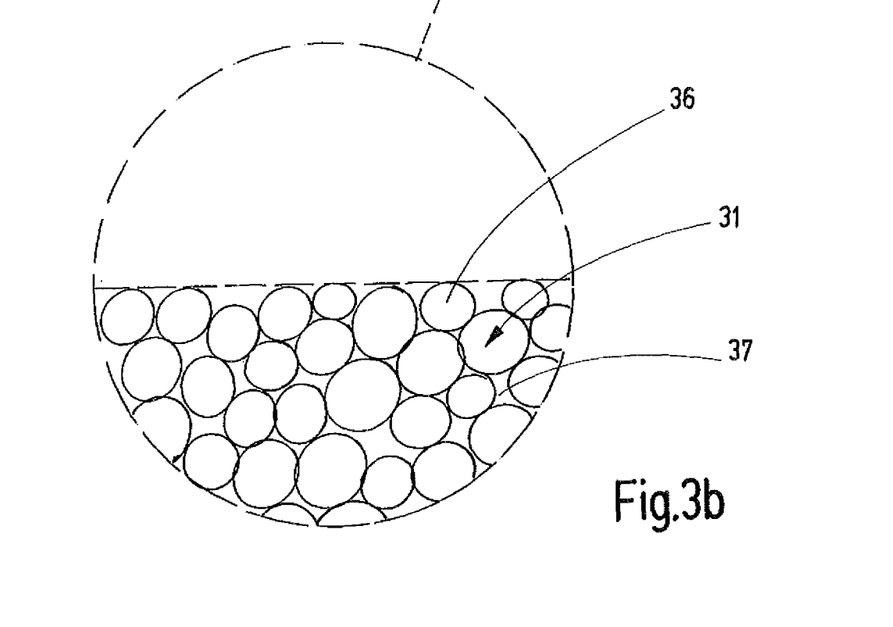
Figure 4:
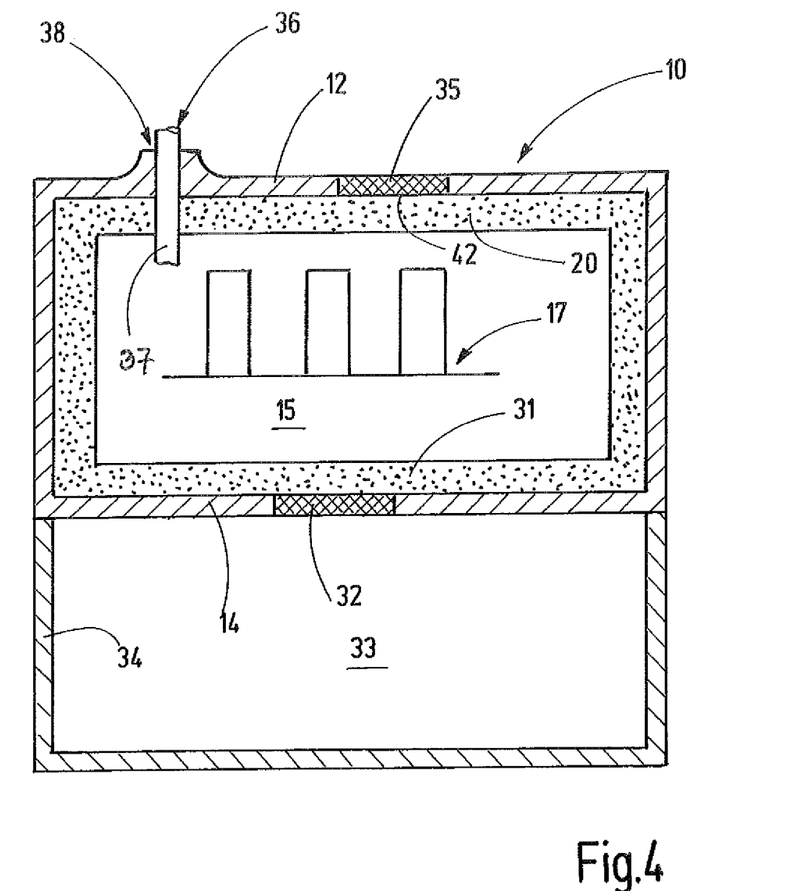

The housing 10 illustrated in FIG. 4 is an embodiment based on the housing 10 according to FIG. 3a. Optionally this housing 10 comprises a pressure relief device 32 that is configured in a flameproof manner and arranged in the wall 14 to which an expansion volume 33 adjoins. This can be separated from the environment by a partial housing 34 and completely closed thereto and also comprise openings via which it is in connection with the environment. As open-pore material the embodiment according to FIG. 4 can comprise a container structure containing bulk particulate material, as explained for example in connection with FIG. 3.

In addition or as an alternative, a pressure relief body 35 can be provided in the wall 12 that allows a pressure relief to the environment. The flameproof pressure relief body 35 can be covered by the porous material 20 at the inside or can be freely accessible. Particularly the pressure relief body 35 can be covered by bulk particulate material in a container structure. The pressure relief body itself can be part of the container structure. Alternatively, another gas permeable limitation structure 42, e.g. a grid, can be arranged between the pressure relief body and the bulk particulate material.

The additional limitation structure can be connected or non-connected with the pressure relief body 35. In addition, a guide through device 36 can be provided in which, for example, a shaft 37 is guided through the housing wall 12. For this the shaft 37 can define a flameproof gap 38 with the housing wall 12. The shaft 37 can be guided through the open-pore material 20 and transmit movements between elements outside the housing 10 to elements inside the housing 10.

Figure 5A:
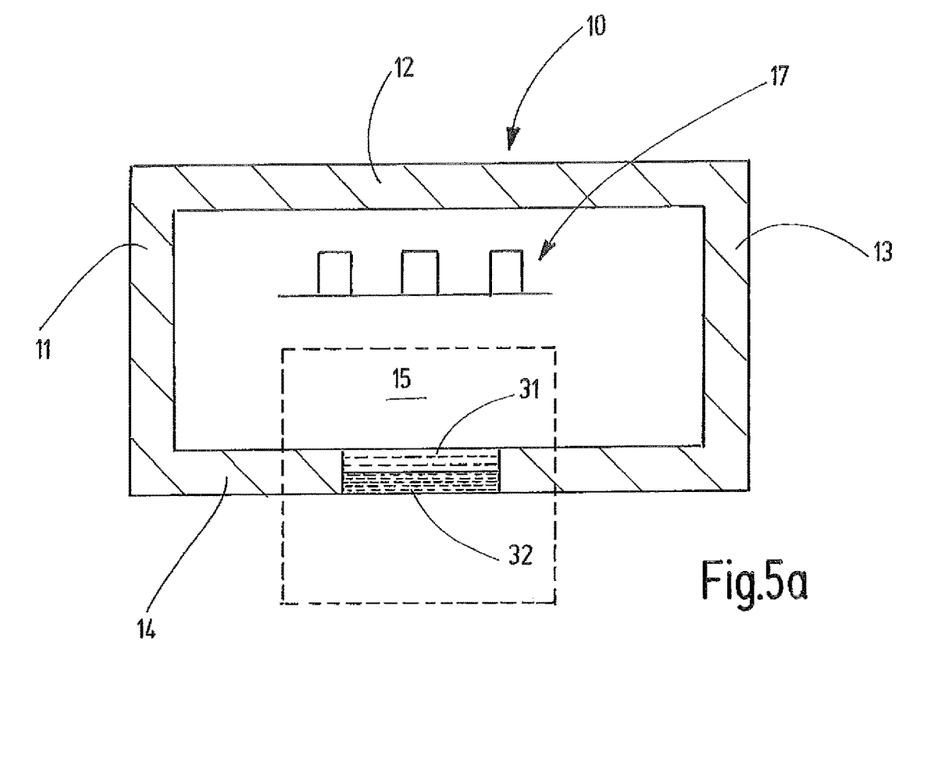
FIG. 5a shows another embodiment of the inventive housing.

FIG. 5a shows an embodiment of an inventive housing 10 with an electrical operating means 17 arranged therein. As illustrated, only one wall 14 of the housing is provided with gas permeable pores material 31 by arranging it completely (as illustrated) or partly (projecting in the inner space 15 of the housing 10) in an opening of the wall 14 of the housing (compare also the enlarged illustration of a section in FIG. 5b that is marked in FIG. 5a). Other walls 12 to 14 of housing 10 may not support porous material or porous material in and/or at the walls. In addition, a gas permeable flameproof body 32 is arranged in the opening. The porous material is arranged between the flameproof pressure relief body 32 and the inner space 15 of the housing such that the open-pore gas permeable material 31 completely covers the pressure relief body 32 with regard to the inner space 15, however, in a gas permeable manner. In order to escape from the inner space 15 of the housing 10 into the environment through the pressure relief body, gas must first flow through the open-pore material 31.

The pressure relief body 32 can be configured in one embodiment to guarantee flameproof condition without the open-pore material 31. Particularly the pressure relief body 32 can comply with the requirements of an applicable standard, e.g. the standard EN 60079-1 with regard to the dimensions of the gaps of the pressure relief body 32 for a specific class, e.g. IIA, IIB or IIC of the standard EN 60079-1 in order to avoid ignition breakthrough. The type (type test) of the pressure relief body 32 can be tested without open-pore material arranged in front thereof of the type shown in FIG. 5a or the specific pressure relief body 32 can be tested without the open-pore body 31 arranged in front thereof specifically illustrated in FIG. 5a (individual test). The pressure relief body 32 can, however, specifically not be configured or not be suitable to ensure a temperature of the outer surface of the pressure relief body 32 or the housing 10 without the open-pore material 31 arranged in front thereof that does not result in a thermal ignition of a specific gas outside the housing 10. The pressure relief body 32 may particularly not be configured or suitable to comply with a specific temperature class of the standard IEC/EN 60079-0. Rather it is preferred that a combined arrangement of porous material 31 and the pressure relief body 32—in the arrangement the porous material and the pressure relief body can be connected or non-connected and be in abutment or arranged with distance—is configured to ensure that exceeding the surface temperature of the surface of the porous body 32 and the outer surface of housing 10 over a pre-defined maximum temperature is avoided. The arrangement of porous material 31 and the pressure relief body 32 is also preferably configured to comply with a specific temperature class, e.g. according to the standard IEC/EN 60079-0. Particularly in case of porous material 31 connected, e.g. sintered, with the pressure relief body 32 it can be considered as two connected segments of one element. However, in embodiments the configuration for explosion-proof compliance is limited to the pressure relief body 32, whereas only the combined arrangement of the open-pore body 31 and the pressure relief body 32 is configured for complying with the requirements of the temperature class.

According to an inventive method for providing a combination of an open-pore material 31 and a pressure relief body 32, the pressure relief body 32 can be configured and preferably tested for being flameproof (e.g. according to standard EN 60079-1) independent from the open-pore material 31, particularly without consideration of open-pore material 31 and an arrangement of the open-pore material 31 and the pressure relief body 32 can be configured for complying with a pre-defined upper limit of the temperature of the pressure relief body 32 and/or a housing 10, e.g. according to a temperature class of the standard IEC/EN 60079-0. Solely the pressure relief body 32 may still be insufficient to achieve a target temperature class. Only with the open-pore material 31 the target temperature class is achieved by the arrangement. The arrangement is configured to comprise the necessary heat capacity and/or heat conductivity to provide a peak temperature of the arrangement below a pre-defined maximum temperature also when heat is introduced into the arrangement due to an explosion. For example, by means of the method any of the arrangements described herein of open-pore material 31 and a pressure relief body 32 can be created. If container structure containing bulk particulate material is used as open-pore material, the configuration of the arrangement for the increased temperature class is particularly simple.

Figure 5B:
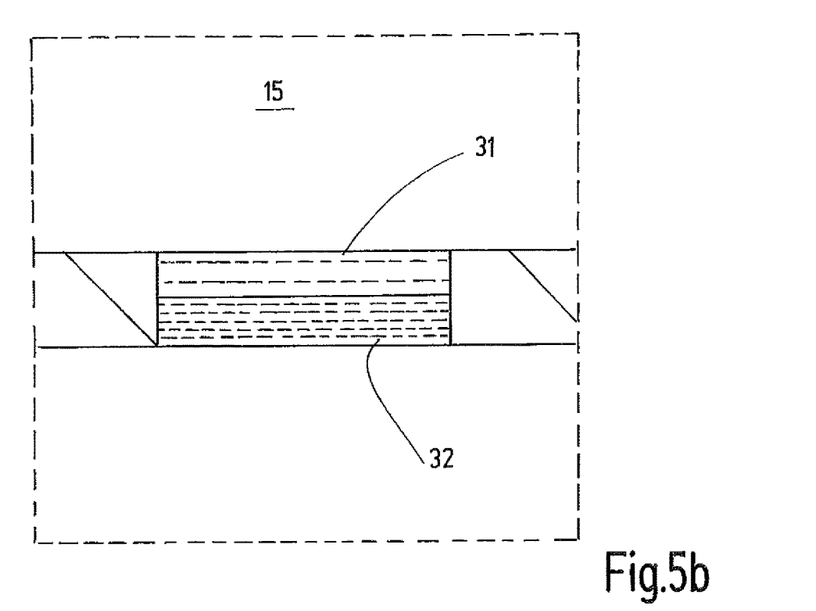

The open-pore material 31 and the pressure relief body 32 are illustrated in FIGS. 5a and 5b as grid structure respectively having one or more grid layers and/or grid plies in each case. Independent from each other the open-pore material 31 and/or the pressure relief body 32 can have a configuration distinguishing from a grid structure.

Figure 6:
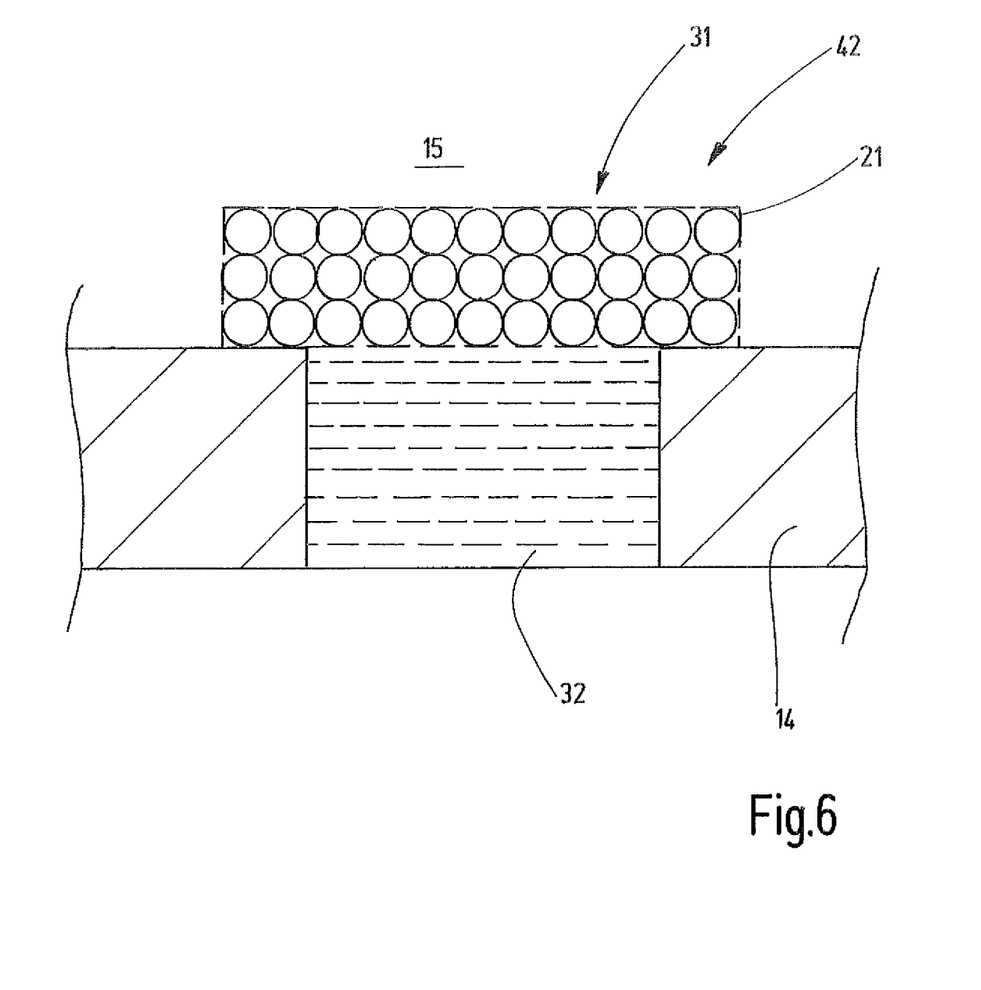
FIG. 6 shows a part of the housing in another embodiment.

For example, FIG. 6 shows an embodiment with container structure 41 filled with bulk particulate material as open-pore material 31. The particulate material can be one of described in connection with the other embodiments. For example, the bulk particulate material can be a granulate, particularly of balls or grains of metal, polymer, glass and/or ceramic. The illustrated particles 39 have a uniform size. The specific application of particles 39 with different size is possible. The embodiment according to FIG. 6 is in addition modified compared with the embodiment according to FIGS. 5a, 5b in that the open-pore material 31 is arranged in the inner space 15 on the opening in which the pressure relief body 32 is arranged.

With the open-pore material 31 a pressure relief body 32 can be completed to an arrangement of the open-pore material 31 and the pressure relief body 32, the requirements with regard to flameproof condition and/or compliance of a maximum temperature of the pressure relief body 32 and/or the housing 10 are not fulfilled solely by the pressure relief body 32. For example, the arrangement of open-pore material 31 and the pressure relief body 32 can comply with a flameproof category or class, which flameproof category or class is not complied with the pressure relief body 32 individually without the open-pore material 31. The pressure relief body 32 can be, e.g. configured and preferably tested to comply with a specific category or class of flameproof condition, e.g. IIA or IIB of the standard IEC 60079-5. The combination of pressure relief body 32 and open-pore material 31 can, e.g. be configured to comply with the requirements of a higher flameproof category or class, e.g. TIE or IIC of the standard IEC 66079-5.

Figure 1:
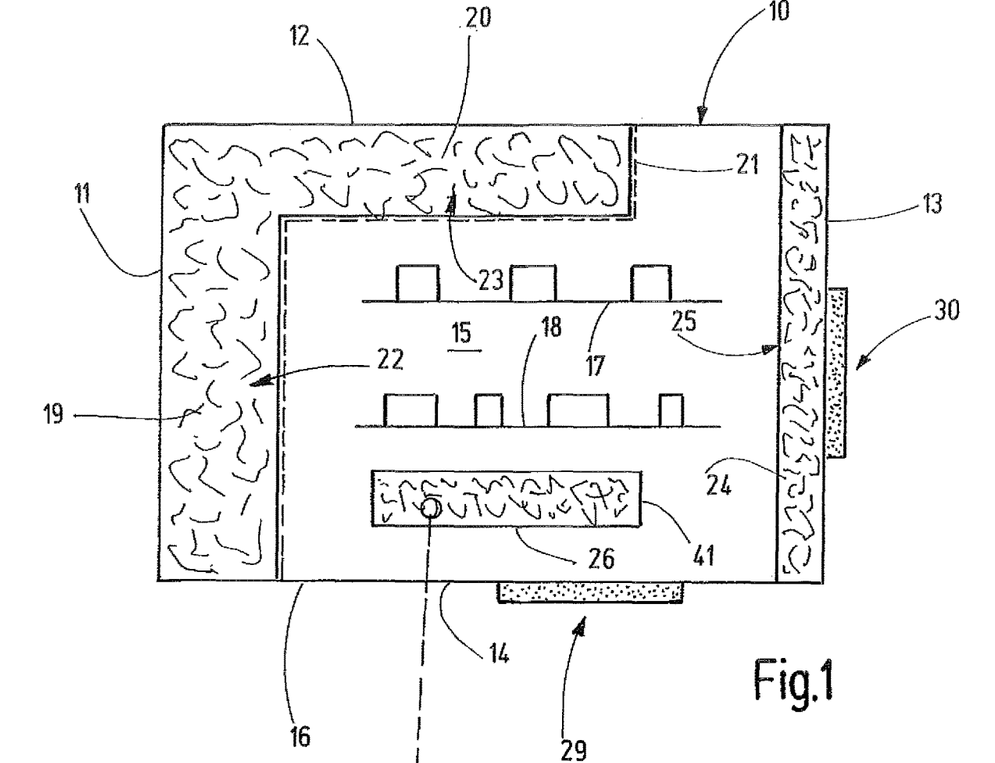

This upgrading of the pressure relief body 32 for achieving a higher temperature or flameproof class can be achieved within and/or on the opening, in which the pressure relief body 32 is arranged as it is for example illustrated in FIGS. 1, 4, 5*a*,*b*, 6, 7 and 8.

Alternatively, the opening that is provided with a pressure relief body can be free from open-pore material 31 or only partly covered or filled, wherein open-pore material 31 is arranged at another location in the inner space 15 of the housing 10 (e.g. body 26) in FIG. 1 or on or in a wall 11 to 14 of the housing 10 and wherein, due to the open-pore material a smaller specific pre-defined maximum temperature is met than without the open-pore material 31. Particularly, due to the open-pore material 31, a maximum temperature of housing 10 that is complied with and/or the flameproof condition can be increased about at least one class (step).

Not only a type of a pressure relief body 32 can be constructively added to the arrangement with the open-pore material 31 in order to create an arrangement of a higher security level of flameproof condition and/or of a lower maximum surface temperature, wherein the pressure relief body 32 is configured to comply with a specific flameproof level and is in addition potentially configured for complying with a specific maximum surface temperature for avoiding an ignition of explosive atmosphere at the outer surface according to a security level. But particularly, an already manufactured and potentially installed pressure relief body 32 can be advantageously completed to any arrangement as exemplarily described herein. In doing so, also a retrofitting of an existing housing 10 or an existing pressure relief body 32 is possible.

Embodiments of an inventive method for providing an arrangement with increased flameproof condition by means of which arrangements described herein comprising open-pore material 31 and a pressure relief body 32 can be provided, comprise arranging of an open-pore material 31 and a flameproof body 32 to form an arrangement. The arrangement of the flame-proof body 32 and the open-pore material 31 is configured for a higher flameproof condition than the flameproof body 32 without the open-pore material 31. The flameproof body 32 can be tested without the open-pore material 31 with regard to flameproof condition. The arrangement can be subject to testing an increased flameproof condition.

Figure 11:
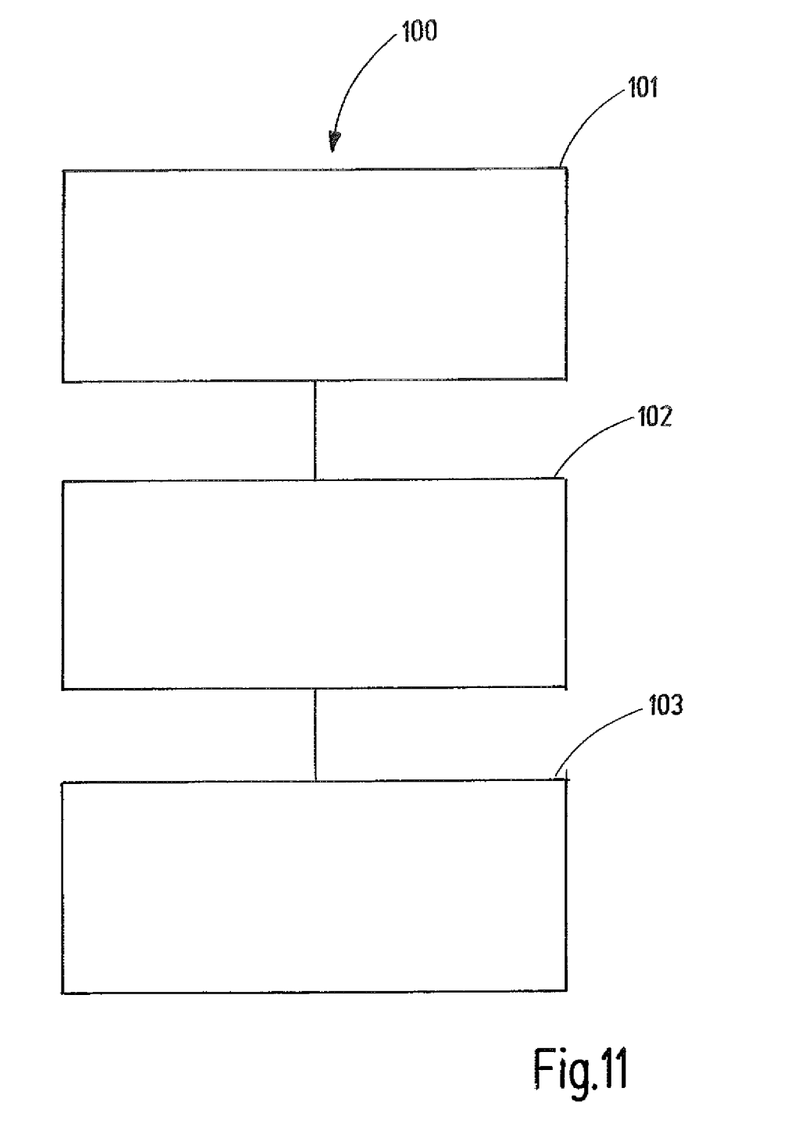
FIG. 11 shows a diagram for illustrating inventive methods.

FIG. 11 shows inventive methods 100 that are exemplarily illustrated, wherein in a step 101 the body 32 is configured for a specific flameproof condition or the body 31 having a specific flameproof condition is provided. In a further step 102 the arrangement of the body 32 and the open-pore material 31 is configured for ensuring compliance with a maximum temperature (e.g. according to the temperature classes T1 to T6) of the flameproof body 32 and/or the housing 10, for the pressure relief of which the body 32 serves, or an arrangement of the flameproof body 32 and the open-pore material 31 for a flameproof level is configured higher than that of the flameproof body 32. In an additional step 103 the body and the open-pore material 31 are arranged to form the arrangement.

Figure 7:
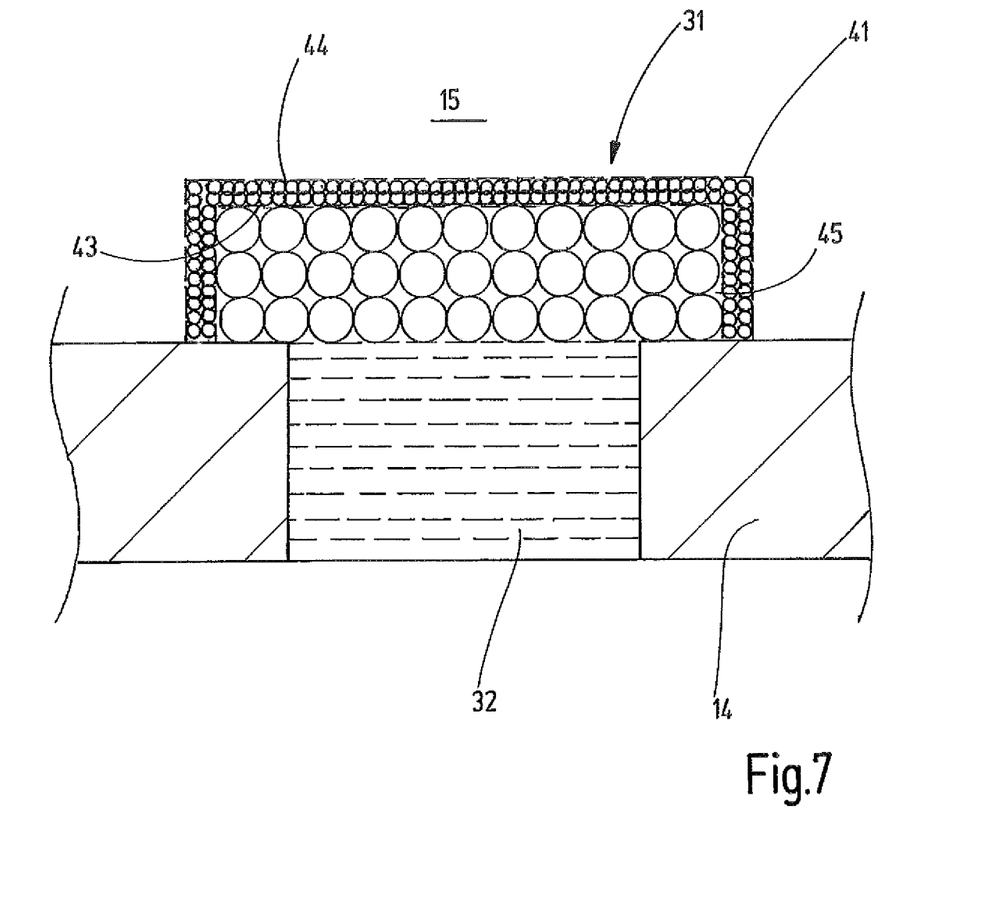
FIG. 7 shows a part of a housing in a modified embodiment compared with FIG. 7.

FIG. 7 shows an embodiment of a part of the wall 14 according to an embodiment according to FIG. 6, wherein in front of the opening in the wall 14 inside the inner space 15 open-pore material 31 is arranged such that gas has to pass the open-pore material before entering the pressure relief body 32. The open-pore material 31 is provided in form of a container structure 41 filled with bulk particulate material. The container structure 41 is separated into two partitions by means of a gas permeable separation structure 43, wherein the partitions are filled with particles of different size. The first partition that is filled with smaller particles than the second partition, covers the second partition toward the inner space 15. Gas from the inner space 15 has to pass through the first partition, through the separation structure 43 and then through the second partition 45 before it reaches the pressure relief body 32. When transitioning from the first partition 44 in the second partition 45 an additional cooling of hot explosion gases can result due to the volume expansion of the free volume between the particles 39 in the first partition 44 compared with the second partition 45. The particles in one partition can distinguish alternatively or in addition to the size in one or more other characteristics from the particles in another partition, e.g. in the composition and/or form. The partitions can have different degrees of filling.

Figure 8:
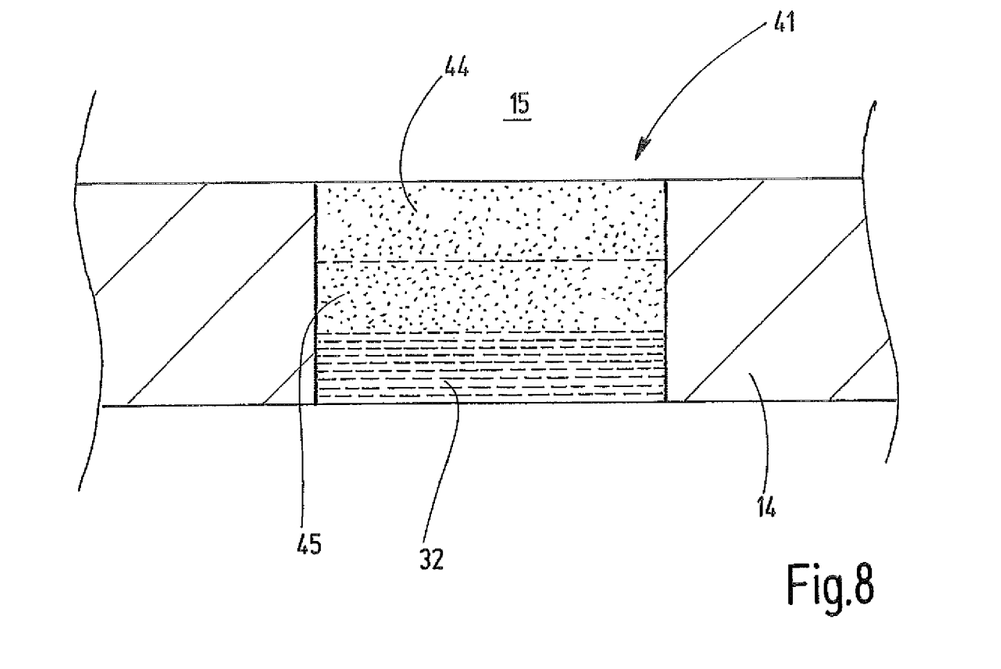
FIG. 8 shows a part of a housing in another embodiment.

FIG. 8 shows an arrangement of a flameproof pressure relief body 32 in an opening of a wall 14. In the opening between the flameproof pressure relief body 32 and the inner space 15 of the housing 10 a container structure 41 filled with bulk particulate material is arranged as open-pore material 31 that completes the pressure relief body 32. The container structure 41 can be separated in two or more partitions 44, 45 that have to be passed by gas from the inner space 15 to the pressure relief body 32 outside.

The inventive housing 10 can be provided with a lining of open-pore material at the inside covering one or preferably at least two sides of the housing 10 for reduction of an internal explosion pressure. In addition or as an alternative, a three-dimensional body of open-pore material can be arranged. The open-pore material can be, for example, bonded fiber material or a container structure 41 containing bulk particulate material.

Figure 9:
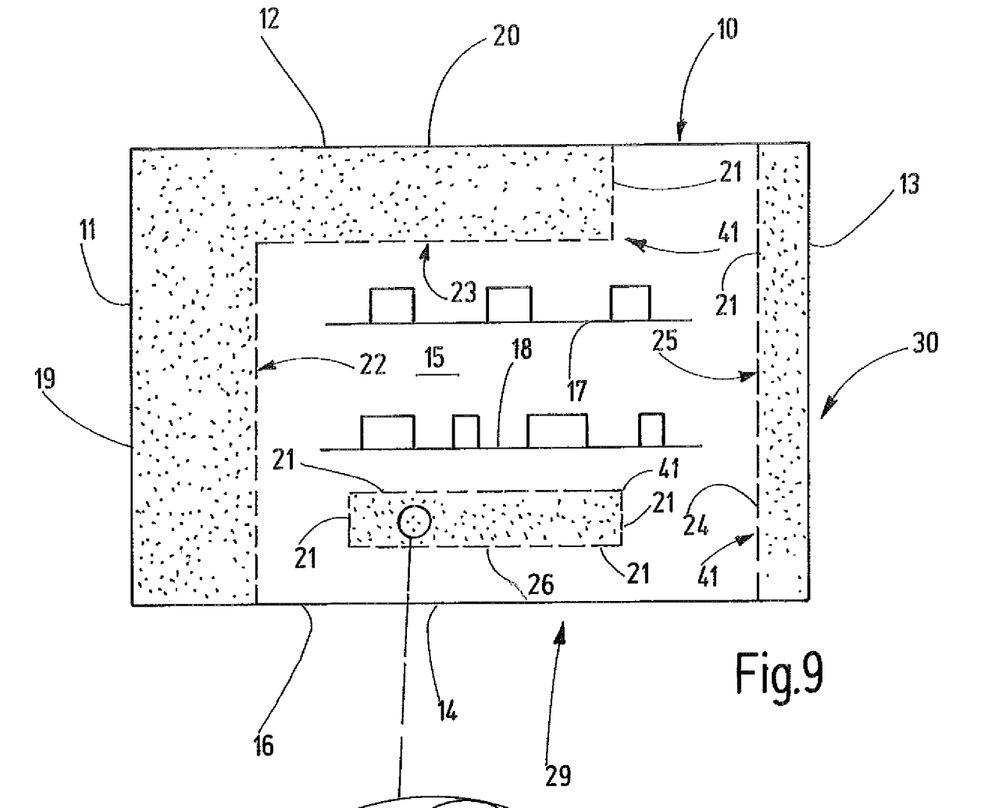
FIG. 9 shows a part of a housing in yet another embodiment.

Yet additional embodiments of an inventive housing 10 are illustrated based on FIG. 9. Housing 10 comprises multiple walls 11, 12, 13, 14 that enclose an inner space 15 closed toward the outside. Together with a non-illustrated bottom and cover the walls 11 to 14 form a wall arrangement 16. Bottom and cover of housing 10 can be rigidly or releasably connected with the walls 11 to 14. They are further also considered as walls.

Parts and components, such as circuit boards, 17, 18 with electrical components arranged thereon that can form ignition sources, can be arranged in the inner space 15.

At least at one of the walls 11, 12, 13, 14 and preferably at least at two walls 11, 12 of the housing 10 open-pore material 19, 20 is arranged that covers the respective wall 11, 12 completely or partly. The open-pore material 19, 20 can be formed by a container structure 41 filled with bulk particulate material. Features explained in connection with other figures of the container structure 41 and/or the bulk particulate material can be optionally applied also on embodiments of the housing 10 illustrated based on FIG. 9. A limitation structure 21, e.g. a grid structure, is part of the container structure 41, wherein the limitation structure 21 forms at least one container wall 21 separate from the walls 11 to 14 of the housing that enclose the inner space 15. This container wall 21 allows gas to pass in the container structure inner space that is at least partly filled with the bulk particulate material and separated by means of the container structure 41 from the remaining inner space 15 of the housing 10. The container wall 21, however, retains the particles 39 (FIG. 10) from entering the area of the inner space 15 complimentary to the container structure 41. Openings in the container wall 21 are dimensioned accordingly small. The grid structure 21 can be perforated sheet housing, a wire grid, a cage or the like.

The bulk particulate material can be directly arranged with contact at the respective wall 11, 12. Preferably no particular material is connected with the wall 11, 12. If the bulk particulate material is arranged with contact at the respective wall 11, 12, the respective wall 11, 12 forms a part of the container structure 41. Alternatively, the container structure 41 can be completely composed from limitation structures 21 that are different from the walls 11 to 14 that limit the inner space 15. These limitation structures 21 can form a cage, for example, that keeps the open-pore material 19, 20 away from the other inner space 15 and that is preferably connected with the housing 10.

The grid structure 21 follows the walls 11 and 12 and is thus arranged over edge. In general the grid structure 21 can match the housing form and/or the wall form of the housing 21, e.g. can comprise a constant distance to the walls 11, 12 along the wall.

The open-pore material 19, 20 comprises surfaces 22, 23 at its side facing the inner space 15 that are arranged including an angle with each other that is smaller than 180° as illustrated.

As an alternative or in addition to the open-pore material 19, 20 another section 24 of open-pore material is arranged opposite the open-pore material 19. It can be the same or another open-pore material as the materials 19, 20. It can also be formed by a container structure 41 having a limitation structure 21 filled with bulk particulate material. It can have the same or a different thickness. Also the open-pore materials 19, 20 can have equal or different thicknesses. The material 24 comprises a surface 25 facing the inner space 15 that opposes the surface 22 and that is arranged in an angle of, e.g. 90° with regard to the surface 23.

The open-pore material 19, 20 and/or 24 forms an inner pressure relief device. An additional or alternative inner pressure relief device can be formed by an open-pore body 26, as exemplarily illustrated in FIG. 9 that is arranged in the inner space 15 of housing 10 and free at least at four, preferably five or six sides, i.e. not in abutment with one of the walls of the wall arrangement. For the open-pore body 26 applies preferably that it is not arranged at one wall respectively at least at four, preferably at five or six sides, as exemplarily illustrated in FIG. 9. Preferably installation spaces are provided between the body 26 and at least four walls respectively in which electrical components, electrical circuits or other electrical operating means can be installed or are installed that can form ignition sources. Particularly the body 26 can be surrounded by electrical components, electrical circuits or other electrical operating means. The body 26 is preferably gas permeable through all three sides. The following explanations of the body 26 apply optionally, also for the open-pore material 19, 20, 24.

As illustrated in FIG. 9, the body 26 is formed from a container structure 41 that is completely or partly filled with bulk particulate material. The gas permeable limitation structure 21 of the container structure 41 separates a partition of the inner space 15 for the filling of bulk particulate material. In doing so, for example a ball bulk can be placed at an arbitrary location in the housing 10. The bulk particulate material can be quartz, sand or glass particle for example. The container structure 41 can contain, for example, a homogeneous mixture of particles 39 that are non-uniform with regard to form, size and/or composition or can contain particles 39 of uniform size, form and composition. The body 26 is preferably free of electrical operating means, particularly free of electrical components. The body 26 itself comprises gaps that do not need to be flameproof. The gaps formed by openings in the container structure 41 as well as interstices between particles of the filling of bulk particulate material do not need to have standardized dimensions such that flameproof condition through the gaps is ensured. The body 26 solely serves for pressure reduction in case of an occurring explosion in the inner space 15 of the housing 10. The housing 10 that comprises the body 26 and/or the porous material 19, 20, 24 does not need to comply with the ignition protection category "protection by powder filling" (Ex-q according to standard TEC 60079-5). Inside the body 26 the bulk particle can still move relative to each other due the degree of filling or the container structure 41 is filled with bulk particles such that they are unable to move relative to each other. Two or more bodies 26 can be arranged in the housing 10.

In case of an explosion that originates from an ignition source between one side of the body 26 and the opposite wall 11, 12, 13 or 14, the pressure wave can impact on one hand directly on the porous body 26 and enter into the bulk of porous material through openings in the limitation structure 41, e.g. a cage side. The kinetic energy is thereby transferred in deformation and/or motion energy of the bulk particles. The particles transfer this energy by impact and friction to other particles 36 and the container structure 41 in order to distribute it in the porous body 26. On the other hand the pressure wave can be reflected on the opposite wall 11, 12, 13 or 14, particularly if it is free of porous material, or at the porous material on the wall 11, 12, 13 or 14 toward the porous body 26 and/or toward the wall opposite to this wall and/or toward the wall arranged in an angle. Also this wall or walls can be free from porous material or can be provided with porous material. From the wall or the porous material the pressure wave can be reflected to another side of the porous body 26 in order to be at least partly absorbed there. The pressure wave can still impact on all accessible sides of the porous body 26 and absorbed from it due to reflection at the walls 11 to 14 and/or porous material, even if the ignition source is placed between a specific side of the porous body 26 and an opposite wall. The bulk of bulk particulate material is shapeless as such, whereby a strong direction dependency due to the filling of the container structure 41 with the bulk is avoided when kinetic energy and/or heat energy is received by the porous body 26 because of the pressure wave. The shape of the container structure 41 and/or the shape that the container structure 41 applies to the filling is preferably rotationally symmetric by a fold of multiples of four or non-discretely rotationally symmetric such that the sides of the porous body 26 or the filling that face the walls 11 to 14 are of comparable size and shape. The body 26 can be particularly arranged centrally between four walls illustrated in FIG. 9 that can be free of porous material 19, 20, 24 different to the illustration in FIG. 9.

Housing 10 is not provided with a pressure relief device 29 and/or 30 that allows a flow connection between the housing inner space and the environment. Such pressure relief devices 29, 30, 32 missing in the housing according to FIG. 9 are described with reference to other embodiments of the invention as porous gas permeable bodies having a gap width and gap length that avoids flame breakthrough (ignition breakthrough) (compare FIGS. 1, 4, 5a, 5b, 6, 7, 8). The housing 10 can be rather pressure-tight.

Housing 10 according to FIG. 9 can be similarly configured as the housing according to FIG. 3 and can comprise porous material in the form of one or more container structures 41 filled with bulk particulate material at all four walls 11, 12, 13, 14 of the housing 10 and optionally in addition at the non-illustrated bottom and/or cover.

Figure 10:
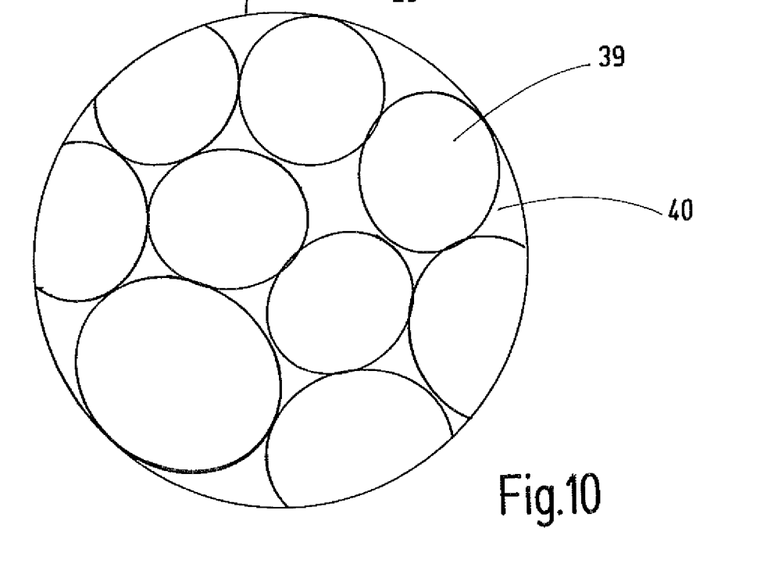
FIG. 10 shows a part of a pressure reducing open-pore body of a housing according to FIG. 9

The open-pore material of the embodiments forms a layer extending along the walls being locally interrupted or also uninterrupted and/or a body 26 that receives a flame front ignited in the inner space 15 and absorbs the resulting pressure wave, as explained with reference to FIGS. 9 and 10.

LIST OF REFERENCE SIGNS

10 housing
11-14 walls
15 inner space
16 wall arrangement
17, 18 circuit boards, electric operating means
19, 20 open-pore material
21 grid structure/limitation structure
22, 23 surfaces of the open-pore material
24 section of the open-pore material
25 surface
26 open-pore body
27 fibers
28 binder
29, 30 pressure relief device
31 open-pore material
32 pressure relief body
33 expansion volume
34 partial housing
35 pressure relief body
36 feedthrough device
37 shaft
38 gap
39 particle of a bulk particulate material
40 pore
41 container structure
42 further limitation structure
43 separation structure
44 first partition
45 second partition

The invention claimed is:

1. An explosion-protected housing comprising:
a plurality of walls that enclose an inner space, at least one wall of the plurality of walls comprises:
an inner side covered with a material, the material being open-pore, bulk, particulate; and
an opening;
a container within the inner space, the container being gas permeable, wherein the container contains an amount of the material that is less than a maximum amount of the material that the container is configured to contain; and
a gas permeable flameproof body arranged in the opening, wherein:
the material is arranged inwardly relative to the gas permeable flameproof body,
the material is configured to at least one of dampen an explosion without arresting flames from the explosion or cool gases from the explosion without arresting the flames from the explosion, and
the gas permeable flameproof body is configured to arrest the flames from the explosion.

2. The explosion-protected housing according to claim 1, wherein:
the plurality of walls and the gas permeable flameproof body are together configured such that at least one of a maximum surface temperature of the explosion-protected housing or a maximum temperature of the explosion-protected housing remains below a pre-defined temperature, and
the material is not flameproof.

3. The explosion-protected housing according to claim 1, wherein the gas permeable flameproof body and the material together are more flameproof than the gas permeable flameproof body alone.

4. The explosion-protected housing according to claim 1, wherein the material is connected to the gas permeable flameproof body.

5. The explosion-protected housing according to claim 1, wherein the material and the gas permeable flameproof body are arranged in a grid.

6. The explosion-protected housing according to claim 1, wherein the material is arranged in a grid.

7. The explosion-protected housing according to claim 1, wherein the at least one wall covered with the material is closed or comprises only flameproof gaps.

8. The explosion-protected housing according to claim 1, wherein the material is arranged in the opening.

9. The explosion-protected housing according to claim 1, wherein the gas permeable flameproof body has an average ratio of gap width to gap length that is less than an average ratio of gap width to gap length of the material.

10. The explosion-protected housing according to claim 1, wherein:
the gas permeable flameproof body is configured to arrest flames in compliance with at least one of Group IIA of standard IEC/EN 60079-1 current as of Mar. 22, 2018; Group IIB of the standard IEC/EN 60079-1 current as of Mar. 22, 2018, or Group IIC of standard IEC/EN 60079-1 current as of Mar. 22, 2018, and
the material fails to arrest flames in compliance with Group IIA of the standard IEC/EN 60079-1 current as of Mar. 22, 2018, Group IIB of the standard IEC/EN 60079-1 current as of Mar. 22, 2018, or Group IIC of the standard IEC/EN 60079-1 current as of Mar. 22, 2018.

* * * * *